United States Patent [19]

Bangs et al.

[11] 4,148,945

[45] Apr. 10, 1979

[54] PROCESS OF METAL PLATING ON PLASTICS

[75] Inventors: Leigh B. Bangs; Carole K. Tuttle; Syamalarao Evani, all of Midland, Mich.

[73] Assignee: The Dow Chemical Company, Midland, Mich.

[21] Appl. No.: 439,454

[22] Filed: Feb. 4, 1974

[51] Int. Cl.$^2$ .............................................. B05D 3/10
[52] U.S. Cl. .................................. 427/304; 427/305; 427/306; 427/400; 427/404; 427/444
[58] Field of Search ................ 117/47 A, 160 R, 118; 204/30; 427/304–306, 404, 444, 307, 400

[56] References Cited

U.S. PATENT DOCUMENTS

| | | | |
|---|---|---|---|
| 2,668,134 | 2/1954 | Horton .................................... | 204/30 |
| 3,317,339 | 5/1967 | Fortner et al. ......................... | 117/118 |
| 3,567,488 | 3/1971 | Rathsack ................................ | 117/118 |
| 3,567,489 | 3/1971 | Rathsack ................................ | 117/47 A |
| 3,620,804 | 11/1971 | Bauer .................................... | 427/307 |
| 3,686,016 | 8/1972 | Macguire et al. ..................... | 117/118 |
| 3,702,285 | 11/1972 | Knorre et al. ........................ | 117/47 A |
| 3,702,782 | 11/1972 | Barozier et al. ...................... | 117/118 |
| 3,733,213 | 5/1973 | Jacob .................................... | 117/47 A |

*Primary Examiner*—Ronald H. Smith
*Assistant Examiner*—Janyce A. Bell

[57] ABSTRACT

The thermoplastic polymer employed in this invention is a rubber modified unsaturated carboxylic acid or anhydride containing polymer which is prepared by polymerizing the monomers in the presence of the rubber in a finely divided form. The surface to be metallized is first aminated with aqueous hydroxylamine or hydrazine, then treated with a noble metal salt solution and thereafter treated with a reducing agent, as needed, to produce a metallized surface having a resistance of 100 ohms/sq. or less. The metallized surface can then be further plated by conventional means.

16 Claims, No Drawings

PROCESS OF METAL PLATING ON PLASTICS

BACKGROUND OF THE INVENTION

Conventional plating of plastics as pointed out in U.S. Pat. No. 3,556,955, conditions the plastic in a strong oxidizing solution, e.g. aqueous sulfuric acid-chromic acid. The plastic is next sensitized in a solution of a reducing agent such as stannous chloride and then activated by immersion in a noble metal salt solution before passing the plastic to an electroless plating bath.

This general method with the prior art polymers suffers from numerous disadvantages among which are the complexities of the process and the hazards and disposal problems with the chromic acid bath as well as lesser physical properties of the plated polymers. Various methods of overcoming some of these problems are proposed in U.S. Pat. Nos. 3,556,955 and 3,701,675. Polymers with acid groups or treated to have acid groups are neutralized with ammonia, alkali solutions or ethylenimine according to U.S. Pat. Nos. 3,567,488; 3,567,489 and 3,607,350. The polymers are then treated with a noble metal salt solution before being plated. U.S. Pat. No. 3,222,218 is similar to Czech Pat. No. 100,373 in that ion exchange groups on a polymer are treated with a noble metal salt and after ion exchange are reduced and then plated. Because plastic materials are non-conductive and inert to metals, adhesion of the metal plate to the plastic is a basic problem in the metallization of plastics.

SUMMARY OF THE INVENTION

The process of this invention provides improvement in adhesion between the plastic and the metallic layer deposited thereon, simplification in processing, elimination of chromic acid oxidizing baths, and improvements in thermal resistance and other physical properties of the plated article.

First, the invention depends on using certain thermoplastic polymers. In particular, the thermoplastic must contain a rubber modifier component in amounts of about 12 to 40 weight percent. It must also contain about 12 to 30 weight percent of an unsaturated acid or anhydride thereof and the balance to make 100 percent of one or more monomers copolymerized therewith. The thermoplastic is the product of polymerizing the monomers in the presence of the rubber in a finely divided form.

Secondly, the process comprises the step of aminating the surface to be metallized with an aqueous hydroxylamine or hydrazine solution, next treating the surface with a noble metal salt solution such as silver and then, as needed, treating the surface with a reducing agent to produce a metallized surface having a resistance of about 100 ohms/sq. or less.

DESCRIPTION OF THE INVENTION

Notwithstanding the art in the field of metallization of plastics, the most commonly accepted plastic material for this use is a polymer of acrylonitrile/-butadiene/styrene (commonly called ABS) and the process employed utilizes a chromic acid oxidizing bath and the subsequent steps previously noted. In fact, not all ABS polymers are generally suitable. Consequently, there is a limited choice of suitable plastic materials from a commercial standpoint.

By this invention, another group of plastic materials may now be utilized and may be metallized by a different, simpler process than the old chromic acid process. In addition to providing good adhesion, the plastics of this invention provide higher heat distortion and other improvements in physical properties.

The results of this invention are considered unique and unexpected since similar results are not obtained if the rubber component is omitted and if other aminating agents are used in place of hydroxylamine or hydrazine.

Essential to the invention is the use of a rubber modified thermoplastic polymer prepared by polymerizing an unsaturated carboxylic acid or anhydride with one or more copolymerizable monomers in the presence of the rubber in finely divided form. The benefits of this invention are not obtained if the rubber is omitted or if the rubber is merely blended or milled with a polymer prepared from the above monomers.

Adhesion is somehow related to the presence of the rubber component although no adequate explanation is presently known for this feature of the invention. In any event, tests demonstrate that the rubber is necessary. For best results, the rubber should be as finely divided as possible since adhesion decreases with coarse rubber particles. By finely divided rubber it is meant rubber particles having an average particle diameter in the range of about 0.1 to $1\mu$ with a maximum particle size of about $5\mu$. Average particle diameters of $5-30\mu$ and higher are considered coarse and unsuitable.

While the presence of the rubber is important, any of a variety of rubbers (elastomers) may be used such as natural rubber; rubbery copolymers of ethylene and propylene; conjugated diene rubbers such as polyisobutylene, polyisoprene and polybutadiene; copolymers of conjugate dienes and alkenyl aromatic monomers such as butadiene-styrene copolymers; nitrile rubbers such as a copolymer of butadiene and acrylonitrile; and the like. Preferred rubbers are the butadiene-styrene copolymers especially the block copolymers. It is known to employ small amounts of other monomers such as acrylonitrile in preparing the preferred rubbers.

Unsaturated carboxylic monomers include acrylic acid, methacrylic acid, ethacrylic acid, 3-butenoic acid, 4-pentenoic acid and the like as well as di- and polycarboxylic acid monomers such as maleic acid, itaconic acid, fumaric acid, citraconic acid, aconitic acid and the like. The anhydrides of said di- and polycarboxylic acids are preferred in this invention. Especially preferred is maleic anhydride.

Copolymerizable monomers may be selected from a wide variety of known monomers including the alkyl acrylates and methacrylates, alkenyl aromatics, vinyl ether and ester monomers, etc. Typical of such monomers are methyl, ethyl and butyl acrylate and methacrylate; styrene, vinyl toluene, t-butyl styrene; vinyl methyl ether, vinyl acetate, etc. Preferred are the alkenyl aromatic monomers and styrene is especially preferred.

The rubber modified unsaturated carboxylic acid or anhydride containing thermoplastic polymer comprises from about 12 to 40 weight percent rubber, preferably about 16 to 22 percent; about 12 to 30 weight percent of said acid or anhydride, preferably about 12 to 25 weight percent; and the balance to make 100 percent of one or more copolymerizable monomers. More preferably the acid or anhydride monomer comprises about 14 to 20 percent of the thermoplastic polymer. A certain minimum acid or anhydride content is necessary to obtain uniform metallization whereas at contents above the maximum, solubilization of the polymer is a problem.

The process of the invention comprises the step of first aminating the surface to be metallized by contacting it with an aqueous solution of hydroxylamine or hydrazine. The invention appears to be specific to the above since ammonia, other amines, and other substituted hydrazines such as methyl or phenyl hydrazine do not achieve the same benefits. The concentration of hydroxylamine or hydrazine can be varied but generally the more concentrated solutions are used in order to reduce the contact time. Even with dilute solutions, the contact time is of the order of minutes. As will be shown later, a longer contact time may be beneficial in that a metallized surface which meets the resistance requirement herein may be obtained in the second step of the process without the need for a subsequent reduction step. This is so because the two aminating agents are themselves reducing agents. Amination of the surface forms salts of the acid groups and halfamide and/or halfamide salts of the anhydride groups.

Following amination of the surface, the surface is contacted with a noble metal salt solution. Examples of noble metal salts that may be used are silver nitrate, platinic chloride, auric chloride, palladium chloride, as well as the complex metal salts such as diamminesilver (I) nitrate.

Finally, the surface may be further contacted with a reducing agent, if needed, to produce a metallized surface having a resistance of 100 ohms/sq. or less, preferably 50 ohms/sq. or less. Resistance of this magnitude is needed in order to deposit subsequent metal layers by conventional electroplating processes. As indicated above, this third step may not be necessary with a longer amination step. Typical reducing agents include formaldehyde, hydrazine, hydroxylamine, sodium borohydride, tartrates, hydroquinone and the like.

It is to be understood that the surface to be metallized is usually rinsed after each of the process steps and that each step requires only a few minutes. The time of contact can be extended but usually the necessary effect from each step occurs very rapidly and long contact times are neither necessary or desirable.

The following non-limiting examples will further illustrate the invention.

EXAMPLE 1

A rubber modified styrene-maleic anhydride thermoplastic was prepared by polymerizing styrene and maleic anhydride in the presence of a finely divided styrenebutadiene (30:70) block copolymer rubber (average particle size in the range of 0.5 to $1\mu$ with a maximum of about $2.0\mu$). The polymer contained about 19% rubber, 16% maleic anhydride and the balance styrene. The polymerization was effected in a ketone solvent at 85°–135° C. using lauroyl peroxide as a catalyst.

An injection molded part of the above polymer was immersed in 10 wt% aqueous hydrazine for 5 minutes and then rinsed. It was next immersed in 0.3 N $AgNO_3$ solution for one minute and rinsed. Finally, the part was immersed in 1 wt% aqueous hydrazine for one minute, rinsed and dried. It had a surface resistivity of 8 ohms/sq.

The metallized part was then electroplated with about 0.002 in. of copper metal (from a copper pyrophosphate bath at 30–35 amps per sq. ft.). The peel strength was measured on an Instron Tester after the part had dried and aged for 24 hours or more. A one inch wide strip of metal plate was peeled off the sample at a 90° angle to the surface at a rate of 1"/min. The peel strength was 3 lbs/in. of width of the strip. If ammonia were used in the first step in place of hydrazine, the peel strength would be only about 1 lb/in.

Small amounts of other thermoplastics may be blended with the above rubber modified polymer. For example, a styrene-acrylonitrile thermoplastic when blended 5:95 (parts by weight) and tested as above gave a peel strength of 2.3 lbs/in. At a 10:90 ratio, the peel strength was 1.5 lbs/in. In another blend of ABS 5:95 the peel strength was 2 lbs/in. With a polycarbonate blend (10:90) the peel strength was 1.1 lbs/in. Each of the above polymer blends was treated with aqueous 10% hydrazine for one minute, 0.3 N $AgNO_3$ in 10% ammonia for 10 minutes and one minute reduction in 5% hydrazine.

EXAMPLE 2

This example illustrates that the final reducing step is not necessary with a longer amination step. The first example was repeated except that immersion in 10% hydrazine was 10 minutes. Following the rinse, the part was immersed in 0.3 N $Ag(NH_3)_2NO_3$. Reduction proceeded at once and the part was coated uniformly with a silver deposit. After 1 minute, the part was rinsed and dried. The part was then electroplated as before and had a peel strength of 2 to 2.8 lbs/in.

The rubber modified styrene-maleic anhydride used in the previous examples is hydrophobic. On its surface, water drops bead up in the presence of air. After a few seconds immersion in the hydrazine solution, the surface is water wettable (contact angle approaches 0°). Analysis by infra red shows the presence of carboxylate, carboxylic acid and amide groups following amination.

By tests with various copolymers it was found that a minimum acid or anhydride content of about 12% was needed in order to get metallization of the surface. Polymers tested included a styrene-acrylic acid copolymer (78:22), an ethylene-acrylic acid copolymer (70:30), general purpose styrene-maleic anhydride (75:25) molding resin; and various blends of rubbers and thermoplastics with a rubber modified polymer similar to example 1 in which the anhydride percent in the blend varied from 11.2% to 23.5%. Tests with styrene-acrylic acid (49:51) and styrene-maleic anhydride (67:33 and 53:47) indicated this range of anhydride or acid content results in dissolution of the polymer by the aminating agent. The results of this study indicated the acid or anhydride monomer content should be in the range of about 12 to 30 weight percent. Most preferably the acid or anhydride comprises about 14 to 20 percent.

In addition, it was found necessary to modify the polymer to include a rubber component in order to obtain the desired adhesion of the metallized layer. Blends of rubber with the polymer were not adequate to obtain the desired level of adhesion, but by polymerizing the monomers such as styrene and maleic anhydride in the presence of finely divided rubber, improved adhesion was obtained. For example, a blend of styrene-maleic anhydride (82:18) with a polybutadiene styrene-acrylonitrile graft rubber (60% diene) gave peel strength of about 0.5 lbs/in over a range of rubber contents of 20 to 40 weight percent in the blend. This can be compared to the results of examples 1 and 2.

The following examples 3 to 5 are results of some of the early screening work which was done to evaluate time and sequence variables.

EXAMPLE 3

The following tests were similar to example 1 except that the hydrazine solution in step 3 was a 5% instead of a 1% aqueous solution. The time ratio in the first column refers to the time in step 1/ step 2/ step 3. The number in parenthesis following the time ratio indicates the number of tests. The surface resistivity and peel strength are an average of the number of tests indicated.

| Time Ratio | Average Surface Resistivity, ohms/sq. | Average Peel Strength lbs/in |
|---|---|---|
| 1/10/1 (2) | $10^5$ | — |
| 5/1/1 (7) | 11.3 | 2.1 |
| 5/10/1 (3) | 20 | 1.7 |
| 5/10/2 (2) | 13.5 | 1.75 |
| 10/1/1 (2) | 5.5 | 1.8 |
| 10/10/1 (2) | 5.5 | 1.6 |

EXAMPLE 4

Example 3 was repeated except that the noble metal salt solution was 0.3 N $AgNO_3$ in 10% ammonia solution.

| Time Ratio | Average surface Resistivity, ohms/sq. | Average Peel Strength lbs/in |
|---|---|---|
| 1/5/1 (2) | 8 | 1.6 |
| 1/10/1 (8) | 7.6 | 1.5 |
| 10/1/1 (2) | 12.5 | 1.5 |
| 10/10/1 (2) | 7.5 | 1.1 |
| 1/10/1* (2) | 9.5 | 2.25 |
| 10/1/1* (2) | 10.5 | 1.6 |

*1% hydrazine in step 3.

EXAMPLE 5

In the following tests the reduction step (step 3) was eliminated from the sequence of process steps according to example 4.

| Time Ratio | Average Surface Resistivity ohms/sq. | Average Peel Strength lbs/in |
|---|---|---|
| 5/1 (6) | 7.1 | 1 |
| 10/1 (6) | 6 | 1.3 |
| 30/1 (1) | 4.5 | 1.5 |
| 35/1 (1) | 4.5 | 2.5 |

EXAMPLE 6

Tests similar to example 1 were made wherein the surface to be metallized was immersed for 10 minutes in 3 M aqueous hydroxylamine, 5 minutes in 0.3 N $Ag(NH_3)_2NO_3$ solution and 1 minute in 5% hydrazine solution. The surface was rinsed after each step. The results are as follows.

| Surface Resistivity, ohms/sq. | Peel Strength lbs/in | |
|---|---|---|
| | ave. | max. |
| 17 | 2.4 | 2.8 |
| 53 | 1.5 | 2.0 |
| 32 | 1.6 | 2.0 |
| 18 | 1.7 | 1.8 |
| 18 | 1.5 | 1.6 |
| 19 | 1.9 | 2.2 |
| 29 | 1.2 | 1.2 |
| 17 | 1.3 | 1.5 |
| 14 | 1.6 | 2.0 |
| 14 | 2.2 | 2.4 |
| average of tests | 1.7 | 2.0 |

EXAMPLE 7

A series of tests similar to example 6 were made except that the noble metal salt solution was 0.3 N $AgNO_3$ in 10% ammonia solution. The results are as follows.

| Surface Resistivity, ohms/sq. | Peel Strength lbs/in | |
|---|---|---|
| | ave. | max. |
| 8 | 1.9 | 2.6 |
| 10 | 1.9 | 2.1 |
| 9 | 1.9 | 2.2 |
| 5 | 1.7 | 2.1 |
| 4.5 | 1.8 | 2.3 |
| 5 | 1.7 | 2.1 |
| average of tests | 1.8 | 2.2 |

EXAMPLE 8

Tests similar to example 6 were made wherein the surface to be metallized was immersed in 3 M aqueous hydrazine for 5 minutes, 0.3 N $AgNO_3$ in 10% ammonia solution for 5 minutes and finally in 5% hydrazine solution for 1 minute. The surface was rinsed after each step. The results are as follows.

| Surface Resistivity, ohms/sq. | Peel Strength lbs/in | |
|---|---|---|
| | ave. | max. |
| 6 | 2.2 | 2.5 |
| 5 | 2.6 | 3.0 |
| 6 | 2.2 | 2.7 |
| 6 | 2.4 | 3.1 |
| 5 | 1.8 | 2.5 |
| 8 | 2.3 | 2.8 |
| average of tests | 2.3 | 2.8 |

EXAMPLE 9

The tests of example 8 were repeated using a time sequence of immersion of 1 minute amination, 10 minutes in silver nitrate solution and 1 minute in reduction step. The rubber modified styrene-maleic anhydride thermoplastic polymer employed was similar to that of example 1 except that the rubber content was about 28 weight percent. The particle size of the rubber was about 0.1 to 0.4μ with a maximum particle size of about 1μ.

| Surface Resistivity, ohms/sq. | Average Peel Strength, lbs/in |
|---|---|
| 7 | 2.7 |
| 9 | 2.1 |
| 9 | 2.4 |
| 11 | 2.4 |
| 7 | 2.5 |

-continued

| Surface Resistivity, ohms/sq. | Average Peel Strength, lbs/in |
|---|---|
| 8 | 2.6 |
| 7 | 3.0 |
| 6 | 2.5 |
| average of tests | 2.5 |

In contrast to the above results, other aminating agents such as phenyl hydrazine, p-phenylenediamine, ammonia, pyridine, diethylenetriamine, triethylenetetraamine, morpholine or 1,3-diaminopropane give inferior results and in some cases no metallization at all.

What is claimed is:

1. A process for metallizing plastic articles formed from a rubber modified unsaturated carboxylic acid or anhydride containing thermoplastic polymer which comprises the steps of
    (a) aminating the surface to be metallized by contacting it with an aqueous solution of hydroxylamine or hydrazine,
    (b) contacting the aminated surface with a noble metal salt solution and
    (c) thereafter, as needed to produce a metallized surface having a resistance of about 100 ohms/sq. or less, treating the surface with a reducing agent; wherein said polymer contains about 12 to 40 weight percent rubber, about 12 to 30 weight percent of said acid or anhydride and the balance to make 100 percent of one or more monomers copolymerized therewith and wherein said polymer is the product of polymerizing the monomers in the presence of the rubber in a finely divided form.

2. The process of claim 1 further comprising the step of depositing one or more metallic layers on the metallized surface.

3. The process of claim 1 wherein the noble metal is silver.

4. The process of claim 1 wherein the rubber content is about 16 to 22 percent.

5. The process of claim 1 wherein the acid or anhydride content is about 12 to 25 percent.

6. The process of claim 1 wherein the acid or anhydride content is about 14 to 20 percent.

7. The process of claim 1 wherein said polymer is a rubber modified styrene-maleic anhydride copolymer.

8. A process for metallizing plastic articles formed from a rubber modified unsaturated dicarboxylic acid anhydride containing thermoplastic polymer which comprises the steps of
    (a) aminating the surface to be metallized by contacting it with an aqueous solution of hydroxylamine or hydrazine.
    (b) contacting the aminated surface with a noble metal salt solution and
    (c) thereafter, as needed to produce a metallized surface having a resistance of about 100 ohms/sq. or less, treating the surface with a reducing agent; wherein said polymer contains about 12 to 40 weight percent rubber, about 12 to 30 weight percent of said anhydride and the balance to make 100 percent of one or more monomers copolymerizable therewith and wherein said polymer is the product of polymerizing the monomers in the presence of the rubber in a finely divided form.

9. The process of claim 8 wherein the noble metal is silver.

10. The process of claim 8 further comprising the step of depositing one or more metallic layers on the metallized surface.

11. The process of claim 8 wherein the polymer is a rubber modified polymer of said anhydride and an alkenyl aromatic monomer.

12. The process of claim 11 wherein said polymer is a rubber modified styrene-maleic anhydride polymer.

13. The process of claim 11 wherein said rubber is a styrene-butadiene rubber.

14. The process of claim 11 wherein the rubber comprises about 16 to 22 percent and the anhydride about 12 to 25 percent.

15. The process of claim 14 wherein the anhydride comprises about 14 to 20 percent.

16. The process of claim 8 wherein aqueous hydrazine is used in step (a).

* * * * *